United States Patent [19]

Houlihan et al.

[11] Patent Number: 5,200,544

[45] Date of Patent: Apr. 6, 1993

[54] RESIST MATERIALS

[75] Inventors: Francis M. Houlihan, Millington; Thomas X. Neenan, New Providence; Elsa Reichmanis, Westfield, all of N.J.

[73] Assignee: AT&T Bell Laboratories, Murray Hill, N.J.

[21] Appl. No.: 825,341

[22] Filed: Jan. 24, 1992

Related U.S. Application Data

[60] Division of Ser. No. 565,074, Aug. 9, 1990, Pat. No. 5,135,838, and a continuation-in-part of Ser. No. 316,051, Feb. 24, 1989, Pat. No. 4,996,136, which is a continuation-in-part of Ser. No. 160,368, Feb. 25, 1988, abandoned.

[51] Int. Cl.$^5$ .................. C07C 309/19; C07C 309/06; C07C 255/50
[52] U.S. Cl. ........................ 558/44; 558/47; 558/54; 558/56; 558/58; 558/413
[58] Field of Search ............ 558/413, 44, 47, 54, 558/56, 58

[56] References Cited

U.S. PATENT DOCUMENTS

| 1,646,785 | 6/1925 | Duisberg et al. | 558/58 |
| 3,840,579 | 10/1974 | Fan | 558/44 X |
| 3,978,228 | 8/1976 | Yoshinaga et al. | 558/54 X |
| 4,310,471 | 1/1982 | Oswald et al. | 558/56 |

FOREIGN PATENT DOCUMENTS 195226  2/1908  Fed. Rep. of Germany ........ 558/47

OTHER PUBLICATIONS

Aldrich Chemical Catalog, (1992), title page and p. 1228. Aldrich Chem. Co. Inc., 1001 West Saint Paul Ave. Milwaukee, Wis. 53233.

March, "Advanced Organic Chemistry", 3rd ed., p. 312 (date not available), John Wiley & Sons, A Wiley Interscience Publications; New York Chichester, Brisbane, Toronto, Singapore.

*Primary Examiner*—Joseph Paul Brust
*Attorney, Agent, or Firm*—Bruce S. Schneider

[57] ABSTRACT

A class of resist compositions sensitive to deep ultraviolet radiation includes a resin sensitive to acid and a composition that generates acid upon exposure to such radiation. A group of nitrobenzyl materials is particularly suitable for use as the acid generator.

1 Claim, 2 Drawing Sheets

RESIST MATERIALS

CROSS REFERENCE TO RELATED APPLICATIONS

This is a division of application Ser. No. 07/565,074 filed Aug. 9, 1990, now U.S. Pat. No. 5,135,838, and a continuation-in-part of co-pending U.S. application Ser. No. 316,051 dated Feb. 24, 1989, now U.S. Pat. No. 4,996,136, which is a continuation-in-part of U.S. patent application Ser. No. 160,368 dated Feb. 25, 1988 (now abandoned) which are both hereby incorporated by reference.

BACKGROUND OF THE INVENTION

1. Field of the Invention

This invention relates to lithographic processes and, in particular, to lithographic processes involving device fabrication.

2. Art Background

Lithographic processes are typically employed in the manufacture of devices such as semiconductor devices. Among the lithographic processes that are available, photolithography is often utilized. Photolithographic processes have the advantage of being suitable for a blanket exposure technique. That is, a material that is sensitive to the exposing light is coated onto a substrate, e.g., a silicon wafer, that is being processed to form a plurality of devices. The coating material, i.e., the resist, is then subjected to light that has been passed through a mask material so that the light reaching the resist corresponds to a desired pattern that is to be transferred into the underlying substrate. Since the exposure occurs simultaneously over an entire device or a number of devices being processed on a substrate, e.g., a silicon substrate, the procedure is considered a blanket exposure.

A blanket exposure procedure is advantageous because it is relatively fast compared to other methods such as the raster scan technique usually employed when the energy used to expose the resist is a beam of electrons. However, generally, resolution obtainable through a blanket exposure with ultraviolet or visible light is somewhat poorer than that achieved with other methods such as electron lithography.

Improved resolution with a blanket exposure is achievable by using deep ultraviolet light. One approach to a photo resist sensitive to deep ultraviolet radiation employs a compound that produces an acid moiety upon irradiation with such radiation together with a polymer that reacts with the generated acid. Typical acid generator/acid sensitive polymer combinations include an onium salt as the photosensitive acid generator and a polymer such as poly(p-t-butoxycarbonyloxystyrene) as the polymer having a reactive substituent.

The use of an inorganic salt such as the onium salt as the acid generator is not entirely desirable. There is a possibility of contamination of the device being processed by inorganic ionic species from the salt. Additionally, ionic acid generators also have the tendency to phase separate from the acid sensitive resin. Therefore organic acid generators having reasonable sensitivity to deep ultraviolet light for use in a photo resist are quite desirable.

SUMMARY OF THE INVENTION

Extremely good sensitivity to deep ultraviolet exposure is achieved utilizing an acid sensitive polymer in combination with an organic acid generator based on a nitrobenzyl structure. In particular, acid generators of the formula

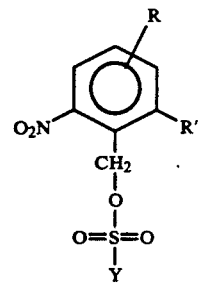

where R is not critical provided R is not acidic and is not so absorbing of ultraviolet light to substantially degrade sensitivity, and where R' is a substituent that has appropriate combination of steric and electron withdrawing characteristics. Exemplary substituents for R' are perfluorinated alkyls, lower alkyls (provided they are not acids or substantially absorb uv light), halogens,

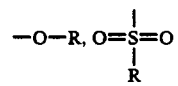

or CN, and exemplary substituents for Y are alkyls such as methyl, substituted alkyls such as trifluoroethyl, aryls such as phenyl, or substituted aryls such as

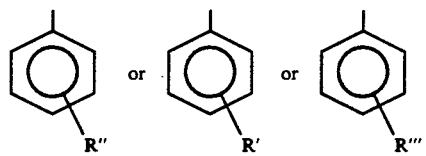

where R" is for example lower alkyl, and R''' is

The particular moiety used for Y is not critical provided it requires a temperature of at least 75° C. to cause splitting of the Y moiety from the remainder of the acid generator. Any tendency for phase separation between the polymer and the acid generator is substantially reduced since these materials are not ionic. For the same reason the possibility of contaminating the underlying substrate is eliminated. The sensitivity of the inventive resist is as good as 2 mJ/cm$^2$. Thus, excellent photosensitivity is achieved.

Although the inventive photosensitive acid generating materials are particularly useful in photolithography, they are also sensitive to electrons and x-rays. Therefore, exposure with these sources is not precluded.

DETAILED DESCRIPTION

For typical acid sensitive polymers having one acid reactive substituent per monomer unit, acid generator concentrations in the range 0.5 to 50 weight percent preferably 1 to 20 weight percent are desirable. Concentrations of photosensitive acid generator less than 0.5 weight percent although not precluded are not desirable because resolution and sensitivity are degraded. Concentrations greater than 50 weight percent are undesirable because excessive acid generation tends to produce poor image quality.

As previously discussed, the photoresists should employ a photosensitive acid generator represented by the formula

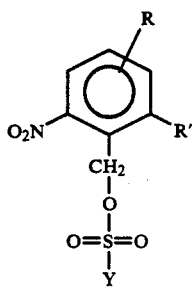

where R is not critical provided R is not acidic and is not so absorbing of ultraviolet light to substantially degrade sensitivity, and where R' is a substituent that has appropriate combination of steric bulk and electron withdrawing characteristics. Exemplary substituents for R' are perfluorinated alkyls, lower alkyls (up to 6 carbon atoms) provided they are not acids or substantially absorb uv light, halogens,

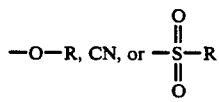

and exemplary substituents for Y are alkyls such as methyl, substituted alkyls such as trifluoroethyl, aryls such as phenyl or substituted aryls such as

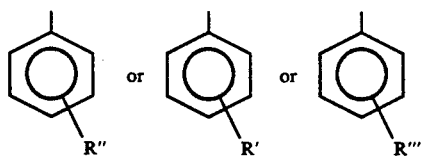

where R" is for example lower alkyl and R''' is

For such molecules it is possible to further substitute on the aromatic rings. However, substituents that are acidic should be avoided because the polymer will tend to degrade before use. A particularly effective material is bis (2-(trifluoromethyl)-6-nitrobenzyl)-1,3-benzene disulfonate which combines high acidity after irradiation and high thermal stability (203° C.).

The sensitivity of the resist material is substantially enhanced by appropriate choice of R' and to a certain extent Y. That is, sensitivity enhancement relative to a material having R' as $NO_2$ is obtained by choosing a substituent that has an appropriate combination of steric and electron withdrawing characteristics. An increase in thermal stability allows post exposure baking at a higher temperature and, in turn, this higher temperature hastens reaction of the acid with the polymer and thus sensitivity. Generally it is desirable to produce the greatest thermal stability and the greatest sensitivity.

Figure 1:
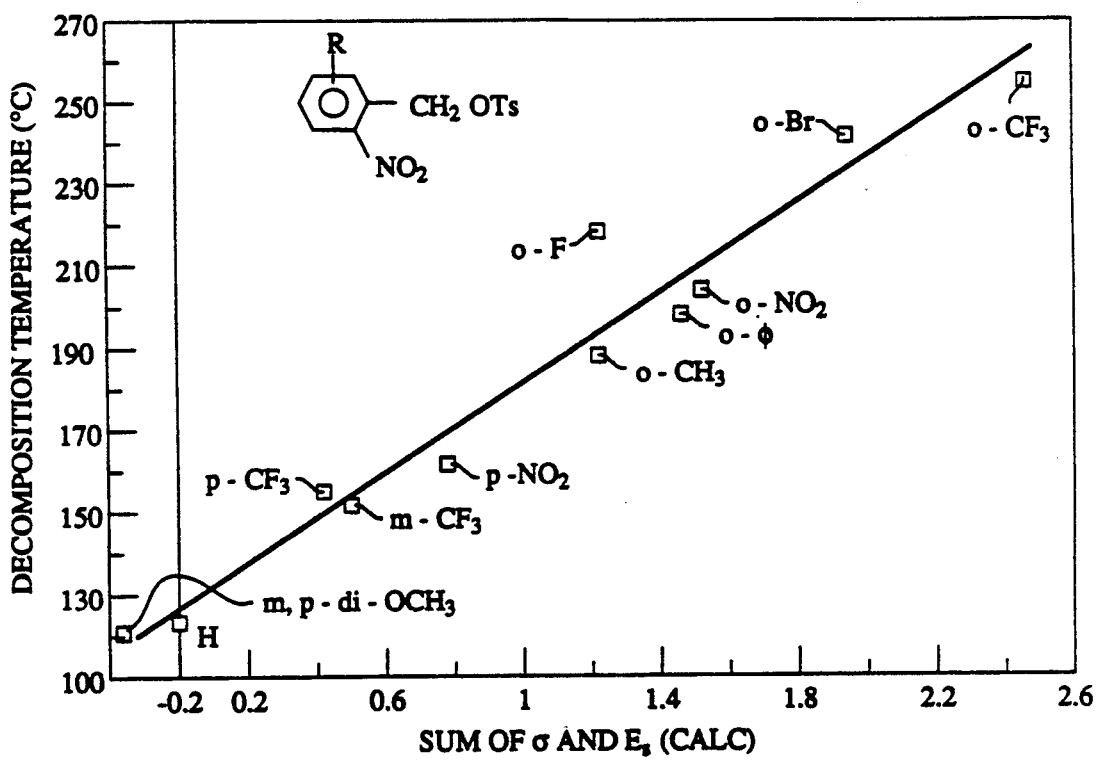

Two factors effect the temperature at which the acid generator decomposes. These factors include the steric hindrance provided by the substituent and the degree of electron withdrawing characteristics of the substituent. These two characteristics are interrelated. It is generally desirable to have substituents that present a great deal of steric hindrance in the plane of the molecule and also that are substantially electron withdrawing. The greater the steric hindrance presented by the molecule the less electron withdrawing characteristics that are needed to produce an improvement in thermal stability relative to the dinitrobenzyl compound. Similarly, the greater the electron withdrawing characteristics, the less steric effect is necessary to produce the same results. The factor used for measuring the steric hindrance is $E_s(calc)$. This is a calculated Taft steric parameter found by using Charton steric parameters as compiled in C. Hansch and A. Leo, "Substituent Constants for Correlation Analysis in Chemistry and Biology", Wiley Interscience (1979), and a linear correlation between Charton steric parameters and experimental Taft steric parameters as also compiled in Hansch and Leo, supra. Electronic factors were measured in two ways. First for those moieties in which no adjacent ortho substituent is present normal sigma values were used as reported in the literature, Hansch and Leo, supra. Second, for those moieties in which an adjacent ortho substituents is present, only the inductive component of the sigma value ($\sigma$) as discussed by Taft in "Steric Effects in Organic Chemistry", edited by Melvin Newman, Wiley & Son, p. 595 (1956), is used. As can be seen from FIG. 1, when the decomposition temperature of various compounds (as measured by differential scanning calorimetry exotherm minimum) is plotted against the sum of $E_s(calc)$ and $\sigma$ for those substituents ortho to the benzylic attachment position or simply $\sigma$ for derivatives having para or meta substitution patterns, a linear relationship is obtained.

Figure 2:
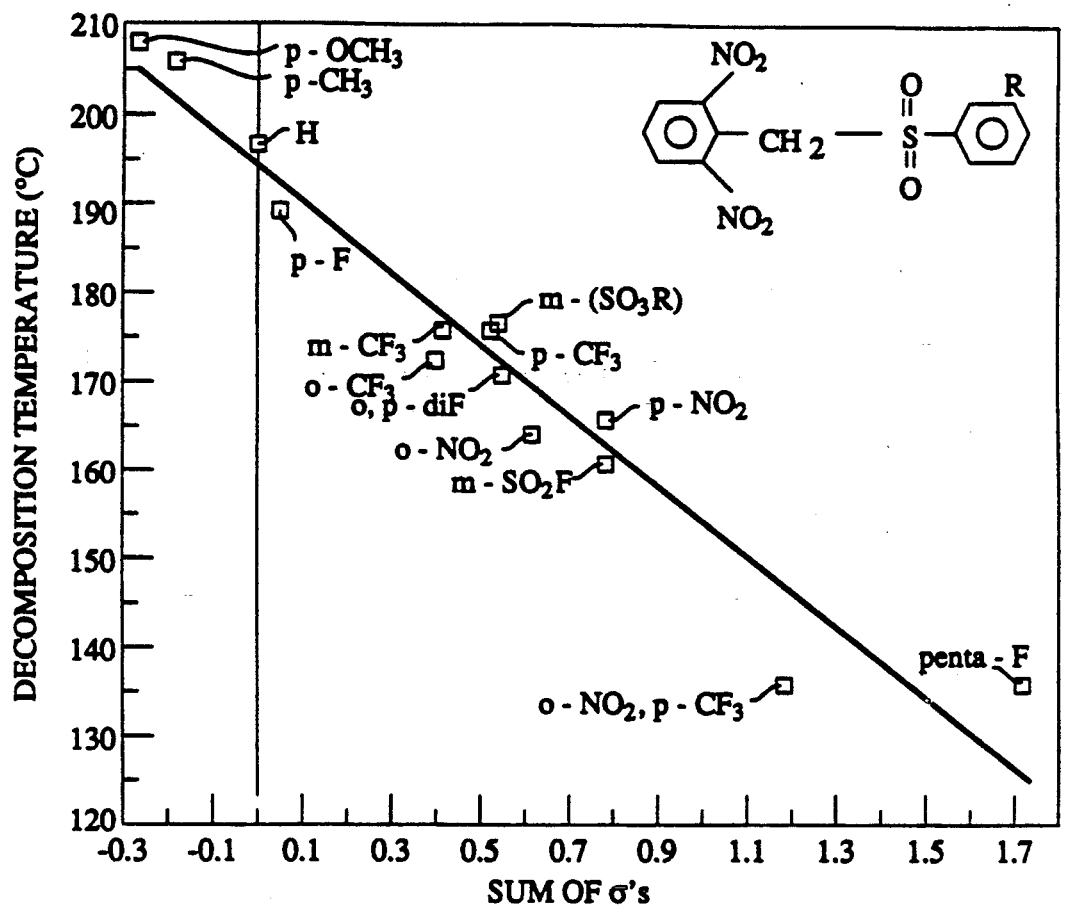

The withdrawing characteristics of substituent Y also have a certain effect on thermal stability. As shown in FIG. 2 the greater the inductive effect of substituent Y the lower the thermal stability. ($\sigma$ is a measure again of the inductive effect). Because substituent Y is relatively far removed from the site of reaction leading to acid generation steric effects due to this substituent are generally not substantial. As can be seen from FIG. 2, when the decomposition temperature of various dinitrobenzyl sulfonate esters is plotted against $\sigma$ or $\sigma$ (if the substituent is located ortho to the sulfonyl attachment point) a linear relation is also obtained.

Resist materials using the inventive acid generators are used as described in co-pending U.S. application Ser. No. 316,051, filed Feb. 24, 1989, which is hereby incorporated by reference. Once the resist is delineated the underlying substrate is processed by techniques generally described in W. M. Moreau, "Semiconductor Lithography", Plenum Press, New York, N.Y. Chapters 12 and 13. For example, the patterned resist is useful as a mask for etching, deposition, or ion implantation.

The following examples are illustrative of suitable processes for fabricating the acid generator and for use of the inventive photoresist.

EXAMPLE 1

Synthesis of 2-(trifluoromethyl)-6-nitrobenzyl bromide.

A 500 mL round bottomed flask was charged with 250 mL of carbon tetrachloride 15.90 g. of 2-(trifluoromethyl)-6-nitrotoluene, 27.60 g. of N-bromosuccinimide, and 11.8 g of benzoyl peroxide. This mixture was brought under reflux and stirred at this temperature for 14 h. The mixture was cooled, filtered and 9.94 g of N-bromosuccinimide together with 4.2 g of benzoyl peroxide was added to the filtrate. This mixture was brought under reflux for 14 h. The mixture was cooled, filtered and the filtrate was stripped of solvent. The crude product was chromatographed on a $SiO_2$ column to give 19.57 g (88.9% yield) of pure product.

EXAMPLE 2

Synthesis of the silver salt of 1,3-benzenedisulfonic acid

A 50 mL round bottomed flask was charged with 20 mL of distilled water and 5.00 g of 1,3-benzenedisulfonyl chloride. This suspension was stirred under reflux 4 h at which time a clear solution was obtained. The mixture was heated under vacuum to remove most of the water and all of the hydrochloric acid. The crude acid was then redissolved in 50 mL of distilled water and 5.30 g of silver carbonate was added slowly. (Effervescence ceases on addition of the last few aliquots.) The aqueous solution was filtered to remove any excess silver carbonate. The solution was stripped of water under vacuum and the white crystalline solid obtained was crushed and dried under high vacuum overnight in the presence of $P_2O_5$. In this way 8.1 g of silver salt was obtained (93% yield).

EXAMPLE 3

Synthesis of bis(2-(trifluomethyl-6-nitrobenzyl)-1,3-benzenedisulfonate.

A 50 mL round bottomed flask was charged with 7.94 g of 1,3-benzenedisulfonate silver salt suspended in 20 mL of dry acetonitrile containing 10.00 g of 2-(trifluoromethyl)-6-nitrobenzyl bromide. The reaction mixture was heated with reflux under argon for 24 h. The reaction mixture was filtered to remove AgBr. The filtrate was stripped of solvent, redissolved in 20 mL of chloroform, filtered and the resultant filtrate stripped of solvent. The crude product was chromatographed over $SiO_2$ using methylene chloride to give a purified product which was then recrystallized from pentane/methylene chloride to give 3.90 g of white crystals (58% yield).

EXAMPLE 4

Synthesis of 2-(trifluoromethyl)-6-nitrobenzyl tosylate.

A 200 mL round bottomed flask was charged under argon with 22.21 g of 2-(trifluoromethyl)-6-nitrobenzyl bromide, 26.20 g of silver tosylate, and 100 mL of dry acetonitrile. The reaction mixture was stirred under reflux for 7 h. The mixture was filtered to remove AgBr, stripped of solvent, redissolved in chloroform, filtered again and partially stripped of solvent. This concentrated solution was recrystallized by slow addition of pentane. The material was recrystallized once more from methylene chloride/pentane to give 21.86 g (75.0% yield) of pure product.

EXAMPLE 5

Synthesis of 2-(trifluoromethyl)-6-nitrobenzyl iodide.

A 200 mL round bottomed flask was charge under dry nitrogen with 35.08 g of 2-(trifluoromethyl)-6-nitrobenzyl tosylate dissolved in 100 mL of dry acetone. To this was added slowly with cooling 28.06 g of anhydrous sodium iodide dissolved in 75 mL of dry acetone. This reaction mixture was stirred overnight at room temperature. The mixture was stripped of acetone under vacuum redissolved in methylene chloride and filtered. The filtrate was extracted with 50 mL of distilled water, dried over anhydrous magnesium sulfate, filtered and the solvent removed under vacuum. By this procedure 29.92 g (97% yield) of product was obtained.

EXAMPLE 6

Synthesis of tris(2-(trifluoromethyl)-6-nitrobenzyl)-1,3,5-benzenetrisulfonate

A 50 mL round bottomed flask under argon was charged with 3.00 g of silver 1,3,5-benzenetrisulfonate dissolved in 20 mL of dry acetonitrile. To this was added 4.66 g of 2-(trifluoromethyl)-6-nitrobenzyl iodide and the reaction mixture was brought under reflux for 12 hours. The mixture was filtered to remove AgI, and the solvent was removed under vacuum. The residue was redissolved in chloroform, filtered and recrystallized by adding carbon tetrachloride. The crude crystals were recrystallized from methylene chloride/pentane to give 1.44 grams of product (33% yield).

EXAMPLE 7

Synthesis of 2,2'-dimethyl-3,3'-dinitrobiphenyl

A 20 mL round bottomed flask equipped with a reflux column under argon was charged with 7.05 g of 2-iodo-6-nitrotoluene and 6.55 of copper bronze. The reaction mixture was heated in an oil bath at 230° C. for 9 hours. The mixture was extracted with methylene chloride and the extract filtered. The extract was stripped of solvent and chromatographed on silica gel using carbon tetrachloride as the eluent. In this way 1.71 g (65% yield) of yellowish crystals were obtained.

EXAMPLE 8

Synthesis of 2,2'-di(bromomethyl)-3,3'-dinitrobiphenyl

A 100 mL three neck round bottomed flask equipped with a reflux column and an addition funnel was charged with 0.24 g of benzoyl peroxide, and 1.49 g of 2,2'-dimethyl-3,3-dinitrobiphenyl dissolved in 40 mL of carbon tetrachloride. This mixture was brought under reflux and 1.75 g of bromide dissolved in 10 mL of carbon tetrachloride was added dropwise. During the addition the reaction flask was irradiated with a 275 WW Sunlamp (GE). After the addition of the bromide the mixture was irradiated under reflux for 2 days. The reaction mixture was stripped of solvents the residue was redissolved in hot chloroform, filtered and the solvent removed under vacuum. The crude product was chromatographed over silica gel using methylene chloride as the eluent. In this way 1.42 g (60% yield) of tan crystals were obtained.

EXAMPLE 9

Synthesis of 2,2'-(tosyloxymethyl)-3,3'-dinitrobiphenyl

A 20 mL flask under argon was charged with 1.20 g of 2,2'-di(bromomethyl)-3,3'-dinitrobiphenyl and 1.87 g of silver tosylate dissolved in 10 mL of dry acetonitrile. The mixture was brought under reflux for 5 h. The mixture was filtered to remove AgBr, stripped of solvent, redissolved in chloroform, filtered, and finally stripped of solvent again. The crude product was chromatographed over silica gel using methylene chloride as the eluent and the resultant product recrystallized from pentane/methylene chloride to give 1.24 g (77% yield) of white crystals.

EXAMPLE 10

Synthesis of 2-methyl-6-nitrobenzyl alcohol

A 100 mL round bottomed flask under dry argon was charged with 5 g of 2-methyl-6-nitrobenzoic acid which was dissolved in 60 mL of dry tetrahydrofuran. To this solution was added slowly with cooling and stirring, 64.17 mL of a 1M solution of $BH_3 \cdot THF$ in THF. The mixture was refluxed for 17 h then the reaction was slowly and carefully quenched with an excess of 10% aqueous hydrochloric acid. The THF was removed under vacuum and the residue was extracted with three 50 mL aliquots of methylene chloride. The combined organic extracts were dried over anhydrous magnesium sulfate, filtered and the solvent removed. The crude product was recrystallized from methylene chloride/pentane to give 4.95 g of yellowish crystals (97% yield).

EXAMPLE 11

Synthesis of 2-methyl-6-nitrobenzyl tosylate.

A 100 mL round bottomed flask equipped with a dropping funnel was charged with 2.50 g of 2-methyl-6-nitrobenzyl alcohol and 3.14 g of tosyl chloride dissolved in 30 mL of dry acetone under argon. To the mixture was added dropwise 3.30 mL of dicyclohexylamine dissolved in 5 mL of dry acetone while cooling so as to keep the temperature below 15° C. The reaction mixture was brought to room temperature and stirred for 1 day. The mixture was filtered to remove dicyclohexylamine hydrochloride, the solvent removed under vacuum, and the residue chromatographed over silica gel using carbon tetrachloride as the eluent. The product was recrystallized from methylene chloride/pentane to give 1.82 g (38% yield) of white crystals.

EXAMPLE 12

Synthesis of 2-phenyl-6-nitrotoluene.

A 100 mL round bottomed flask under argon was charged with 480 mg of tetrakis(triphenylphosphine)-palladium(0), and 3 g of 2-bromo-6-nitrotoluene dissolved in 50 mL of degassed, toluene. To this was added under argon 9 mL of a 2M degassed $Na_2CO_3$ aqueous solution, and then 1.7 g of phenylboronic acid dissolved in 20 mL of ethanol was added. The mixture was refluxed for 6 h with stirring. Residual boronic acid was removed by treatment with 30% $H_2O_2$ for 1 hour. The mixture was extracted with methylene chloride, washed with saturated brine, the combined organic extracts were dried over anhydrous magnesium sulfate, filtered and the solvent removed. The residue was chromatographed over silica gel using methylene chloride as the eluent to give 1.78 g (60% yield) of brownish crystals.

EXAMPLE 13

Synthesis of 2-phenyl-6-nitrobenzyl bromide

The procedure of Example 8 was employed, except that the starting material was 2 g of 2-phenyl-6-nitrotoluene which was reacted with 1.5 g of bromine and 0.110 g of benzoyl peroxide. In this way, 2 g (77% yield) of yellowish crystals were recovered.

EXAMPLE 14

Synthesis of 2-phenyl-6-nitrobenzyl tosylate.

The procedure of Example 4 was used except that the starting material was 1.50 g of 2-phenyl-6-nitrobenzyl bromide which was reacted with 1.86 g of silver tosylate. In this way, 1.5 g (79% yield) of yellowish crystals were obtained.

EXAMPLE 15

Synthesis of 2-(3-nitrophenyl)-6-nitrotoluene.

The procedure of Example 12 was used except that the starting material was 1.3 g of 2-nitrophenylboronic acid which was reacted with 3 g of 2-bromo-6-nitrotoluene and 0.480 g of tetrakis(triphenylphosphine)palladium(0). In this way, 2.8 g (79% yield) of yellowish crystals were obtained.

EXAMPLE 16

Synthesis of 2-(3-nitrophenyl)-6-nitrobenzyl bromide.

The procedure of Example 8 was used except that the starting material was 0.80 g of 2-(3-nitrophenyl)-6-nitrotoluene which was reacted with 0.49 g of bromine and 33 mg of benzoyl peroxide. In this way, 0.80 g (77% yield) of yellowish crystals were obtained.

EXAMPLE 17

Synthesis of 2-(3-nitrophenyl)-6-nitrobenzyl tosylate.

The procedure of Example 4 was used except that the starting material was 1.17 g of 2-(3-nitrophenyl)-6-nitrobenzyl bromide which was reacted with 1.02 g of silver tosylate. In this way, 0.60 g (40% yield) of yellowish crystals were obtained.

EXAMPLE 18

Synthesis of silver tresylate.

The procedure of Example 2 was used except that the starting material was 4.30 mL of 2,2,2-trifluoroethanesulfonyl chloride. The crude acid was reacted with 10 g of silver carbonate giving after workup 10.63 g (99% yield) of silver

EXAMPLE 19

Synthesis of 2-(trifluoromethyl)-6-nitrobenzyl tresylate.

The procedure of Example 3 was used except that the starting material was 2.20 g of silver tosylate which was reacted with 3.00 g of 2-(trifluoromethyl)-6-nitrobenzyl bromide. After reflux for 48 h workup gave 1.43 g (34% yield) of white crystals.

EXAMPLE 20

Synthesis of 2-Nitro-5-(trifluoromethyl)benzyl bromide.

The procedure of Example 1 was used except that 4.00 g of 2-nitro-5-(trifluoromethyl)toluene was employed as starting material and that aliquots of only 1.18 g each of benzoyl peroxide were used during the two additions of reagents. In this way 3.09 g (54% yield) of a yellowish oil was recovered.

EXAMPLE 21

Synthesis of 2-nitro-5-(trifluoromethy)benzyl tosylate.

The procedure of Example 4 was used except that 2.00 g of 2-nitro-5-(trifluoromethyl)benzyl bromide was used as a starting material. In this way 1.61 g (61% yield) of white crystals were recovered.

EXAMPLE 22

Synthesis of 2-nitro-6-fluorobenzyl bromide.

The procedure of Example 20 was employed except that 10.0 g 2-nitro-6-fluorotoluene was used as starting material. In this way 6.70 g (44% yield) of white crystals were obtained.

EXAMPLE 23

Synthesis of 2-nitro-6-fluorobenzyl tosylate.

The procedure of Example 4 was employed except that 3.00 g of 2-nitro-6-fluorobenzyl tosylate was used as starting material. In this way 3.60 g (86% yield) of white crystals were obtained.

EXAMPLE 24

Synthesis of 2-nitro-6-bromobenzyl bromide.

The procedure of Example 20 was employed except that 10.0 g of 2-nitro-6-bromotoluene was used as starting material. In this way 13.3 g (97% yield) of white crystals were obtained.

EXAMPLE 25

Synthesis of 2-nitro-6-bromobenzyl tosylate.

The procedure of Example 4 was employed except that 3.00 g of 2-nitro-6-bromobenzyl bromide was used as the starting material. In this way 1.50 g (38% yield) of yellowish crystals were obtained.

EXAMPLE 26

Synthesis of 2-nitro-4-(trifluoromethyl)benzyl alcohol.

The procedure of Example 10 was employed except that 1.00 g of 2-nitro-4-(trifluoromethyl)toluic acid was used as starting material which was reacted with 9.0 mL of 1M $BH_3$. THF solution in THF. In this way after chromatography over silica gel with methylene chloride 0.80 g (82% yield) of white crystals were obtained.

EXAMPLE 27

Synthesis of 2-nitro-4-(trifluoromethyl)benzyl tosylate.

The procedure of Example 11 was employed except that 3.50 g of 2-nitro-4-(trifluoromethyl)benzyl bromide was used as starting material. In this way after workup, 3.25 g (65% yield) of white crystals were obtained.

EXAMPLE 28

Synthesis of 2,6-Dinitrobenzyl 4-(trifluoromethyl)benzenesulfonate.

The procedure of Example 11 was employed except that the reagents were 2.00 g of 2,6-dinitrobenzyl alcohol, 2.71 g of 4-(trifluoromethyl)benzenesulfonyl chloride and 2.2 mL of dicylohexylamine. The crude product was recrystallized using carbon tetrachloride/chloroform to give 1.55 g (38% yield) of white crystals.

Further compounds were prepared as shown in Table 1.

TABLE 1

Synthetic Data of 2-Nitrobenzyl Sulfonate Ester Derivatives

| Compounds[a] | | % YIELD | SYNTHETIC METHOD[d] |
|---|---|---|---|
| $R_a$ | $R_b$ | | |
| 6-$NO_2$ | 9-$CF_3$ | 48 | Example 11 RT = 3h |
| 6-$NO_2$ | 10-$CF_3$ | 69 | Example 11 RT = 2h |
| 6-$NO_2$ | 11-$CF_3$ | 38 | Example 11 RT = 17h |
| 6-$NO_2$ | 11-F | 62 | Example 11 RT = 17h |
| 6-$NO_2$ | 9-11 di-F | 58 | Example 11 RT = 4h |
| 6-$NO_2$ | 10-$SO_3R$[b] | 50 | Example 11 RT = 4h |
| 6-$NO_2$ | tresyl[c] | 52 | Example 3 RT = 48 |
| 6-$NO_2$ | 2-$NO_2$ | 66 | Example 11 RT = 4h |
| 6-$CF_3$ | 11-$CH_3$ | 80 | Example 3 RT = 17h reflux |
| 5-$CF_3$ | 11-$CH_3$ | 61 | Example 3 RT = 17h |
| 4-$CF_3$ | 11-$CH_3$ | 65 | Example 11 RT = 17h |
| 6-$CF_3$ | tresyl[c] | 34 | Example 3 RT = 48 |
| 6-$CF_3$ | Penta-F | 14 | Example 3 RT = 48h reflux |
| 6-F | 11-$CH_3$ | 86 | Example 3 RT = 17h |
| 6-Br | 11-$CH_3$ | 38 | Example 3 RT = 17h |

Figure 3:
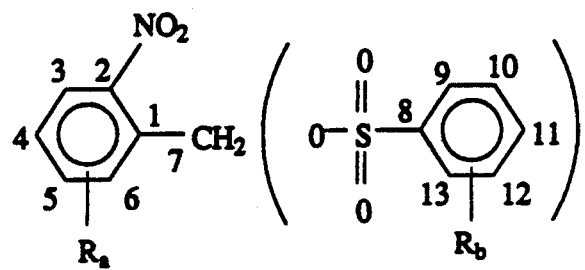

[a] See FIG. 3 for structure
[b] R = 2,6-dinitrobenzyl
[c] ester of Tresic acid
[d] RT = Reaction time

LITHOGRAPHY

EXAMPLE 29

The material of Example 3 was evaluated for lithographic properties. To 238 milligrams of bis(2-trifluoromethyl-6-nitrobenzyl)-1,3-benzene disulfonate was added 1.5 grams of poly(t-butoxycarbonyloxystyrene-sulfone). The mixture was dissolved in 15 mL of cyclohexanone. The resulting solution was then filtered through a stack of Teflon ® filter disks having a porosity from upmost disk to lowermost disk of 1.0, 0.5, and 0.2 µm, respectively. Approximately 2 mL of the filtrate was placed on a 4 inch silicon wafer (the 110 crystallographic plane) and spun at a rate of 2000 rpm.

The wafer was placed on a hot plate, brought to a temperature of 115° C., and maintained at this temperature for 90 seconds. The wafer was placed on the sample holder of a Karl Süss Incorporated, model MA56A contact aligner. This aligner was fitted with a Lamda Physik Excimer laser operating at 248 nanometers. An exposure was done through a mask having a series of lines and spaces ranging from 2 µm to 0.5 µm in dimension. An exposure dose of 7.5 mJ per $cm^2$ was employed.

The wafer was brought to 135° C. on a hot plate and maintained at this temperature for 1 minute. The wafer was immersed for 30 seconds in an approximately 0.18N aqueous solution of tetramethyl ammonium hydroxide. The resulting developed resist exhibited the desired resolution to 0.5 µm—the resolution limit of the mask.

EXAMPLE 30

The procedure of Example 29 was followed except that 183 milligrams of 2-nitro 6-methylbenzyl tosylate was used instead of the bis(2-(trifluoromethyl)-6-nitrobenzyl)-1,3-benzenedisulfonate. Additionally the preexposure bake was performed at 115° for 2 minutes and the postexposure bake was done at 115° C. for 1 minute. The exposure was performed through a mask that produced a different dose at various portions of the coated resist. The resulting exposure showed a sensitivity of 45 mJ per cm$^2$ as measured by determining which was the smallest exposure dose necessary to produce, after development, a totally cleared exposed region.

EXAMPLE 31

The procedure of Example 30 was followed except 200 milligrams of 2-nitro 6-phenylbenzyl tosylate was employed instead of 2-nitro 6-methylbenzyl tosylate. The sensitivity was approximately 60 mJ per cm$^2$.

EXAMPLE 32

The procedure of Example 30 was employed except 223 milligrams of 2-nitro 6(nitrophenyl)benzyl tosylate was employed rather than 2-nitro 6-methylbenzyl tosylate. The exposure sensitivity was 90 mJ per cm$^2$.

EXAMPLE 33

The procedure of Example 30 was used except that 319 milligrams of 2-nitrodiphenylbenzyl tosylate was employed rather than 2-nitro 6-methylbenzyl tosylate. The resulting sensitivity was 62 mJ per cm$^2$.

Further lithographic data is shown in Table 2. In all cases, the solutions were prepared using poly(t-butoyxycarbonyloxy styrene-sulfone) and approximately 8 mol percent (relative to the number of t-butoxy carbonyloxy appendages in the polymer) of the substituted nitrobenzyl ester and cyclohexanone as the solvent. The preexposure bake was performed at 115° for 2 minutes and the postexposure bake was done at 115° for 1 minute. Additionally, the exposure was performed through a mask that produced a different dose at various portions of the coated resist. The resulting exposed wafer was immersed for 30 sec in isopropyl alcohol. The sensitivity listed in Table 2 is the smallest exposure dose necessary to produce after development, a totally cleared exposed region.

TABLE 2

Lithographic Properties of 2-Nitrobenzyl Sulfonate Ester Derivatives

| Compounds[a] | | SENSITIVITY | |
|---|---|---|---|
| $R_a$ | $R_b$ | mJ/cm$^2$ | CONTRAST |
| 6-NO$_2$ | 9-CF$_3$ | 8 | >10 |
| 6-NO$_2$ | 10-CF$_3$ | 10 | >10 |
| 6-NO$_2$ | 11-CF$_3$ | 13 | 10 |
| 6-NO$_2$ | 11-F | 18 | 5 |
| 6-NO$_2$ | 9,11-dif | 14 | 9 |
| 6-NO$_2$ | 10-SO$_3$R[b] | 8 | 4 |
| 6-NO$_2$ | 9-NO$_2$ | 17 | 8 |
| 6-CF$_3$ | 11-CH$_3$ | 43 | 10 |
| 4-CF$_3$ | 11-CH$_3$ | 106 | 5 |
| 5-CF$_3$ | 11-CH$_3$ | 65 | 9 |
| 6-CF$_3$ | tresyl[c] | 15 | 5 |
| 6-F | 11-CH$_3$ | 72 | 5 |
| 6-Br | 11-CH$_3$ | 72 | 6 |
| 6-NO$_2$ | 11-NO$_2$ | 17 | 4 |
| 6-NO$_2$ | 11-CH$_3$ | 25 | >10 |

[a] See FIG. 3 for position assignment of $R_a$, $R_b$.
[b] R = 2,6-dinitrobenzyl
[c] Ester of Tresic acid

We claim:
1. A material represented by the formula

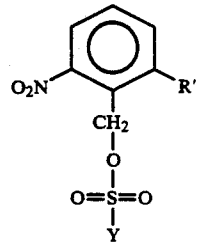

where R' is a perfluorinated alkyl, lower alkyl, alkoxide, or cyano, and Y is an alkyl, substituted alkyl, aryl, or substituted aryl.

* * * * *